United States Patent
Nakata

(10) Patent No.: US 6,667,550 B2
(45) Date of Patent: Dec. 23, 2003

(54) INSTALLATION STRUCTURE AND METHOD FOR OPTICAL PARTS AND ELECTRIC PARTS

(75) Inventor: Hidehiko Nakata, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 81 days.

(21) Appl. No.: 10/076,585

(22) Filed: Feb. 19, 2002

(65) Prior Publication Data

US 2002/0071642 A1 Jun. 13, 2002

Related U.S. Application Data

(63) Continuation of application No. PCT/JP99/04908, filed on Sep. 9, 1999.

(51) Int. Cl.[7] .................. H01L 23/06; H01L 23/48; H01L 23/52; H01L 29/40
(52) U.S. Cl. .................. 257/737; 257/684; 257/777
(58) Field of Search .................. 257/684, 737, 257/777–780; 438/613–615

(56) References Cited

U.S. PATENT DOCUMENTS 6,444,563 B1 * 9/2002 Potter et al. .................. 438/615

FOREIGN PATENT DOCUMENTS

JP    9-102497    4/1997
JP    10-150074   6/1998

* cited by examiner

Primary Examiner—Cuong Nguyen
(74) Attorney, Agent, or Firm—Staas & Halsey LLP

(57) ABSTRACT

The invention relates to an installation technique for optical parts and electric parts. More particularly, it provides an installation structure and an installation method for optical modules that are applied to an optical communication field. The installation structure and the installation method can permit large tolerance of angular deviation in the provisional mounting, and can realize automatic positioning with high precision in the final mounting. The structure includes: a substrate on which a plurality of first metal pads are formed; a part to be mounted having second metal pads corresponding to the positions of the first metal pads; and solder bumps for connecting between the first and second metal pads to match the installation positions of these metal pads based on the surface tension of the solder bumps when the solder bumps are fused. In this structure, the substrate and/or the mounted part has at least two metal pads having larger areas than those of other metal pads, in the vicinity of the center of the substrate and/or the mounted part.

7 Claims, 8 Drawing Sheets

INSTALLATION STRUCTURE AND METHOD FOR OPTICAL PARTS AND ELECTRIC PARTS

CROSS-REFERENCE TO RELATED APPLICATIONS

This application is a continuation of PCT/JP99/04908 filed on Sep. 9, 1999.

TECHNICAL FIELD

The present invention relates to an installation technique for optical parts and electric parts. More particularly, this invention relates to an installation structure and an installation method for optical modules that are used in the optical communication field.

BACKGROUND ART

Conventionally, the positioning of an optical waveguide and an optical element has prevented cost reduction in the process of manufacturing an optical module. Particularly, accurate positioning in the order of micrometers (μm) has been required to achieve an optical coupling between an optical waveguide and a laser diode (LD) as an optical element. As an installation method for easily carrying out this positioning, there is a self-alignment installation method for the positioning by utilizing the surface tension of solder.

According to this installation method, a plurality of metal pads that become the basis of positioning are formed on a substrate, and solder bumps are prepared on these metal pads. On the optical part that is to be mounted on the substrate, metal pads that become the basis for the positioning are also provided corresponding to these metal pads on the substrate. Next, the optical part is provisionally mounted on the substrate based on rough positioning such that the metal pads are brought into contact with the solder bumps on the substrate. Last, the solder bumps are fused by heating the substrate, and the centers of the metal pads on the optical part side are attracted to the centers of the metal pads on the substrate side, based on the surface tension of the solder. As a result, the substrate and the optical part are positioned together with high precision.

According to this installation method, in order to carry out the positioning of an optical part and a substrate to be mounted with this optical part in higher precision, it is effective to reduce the diameter of each metal pad (Shingaku Giho, OQE93-145, 1993, pp. 61–66, (literature 1)). In the mean time, from the viewpoint of achieving compactness and integration, it has also been demanded to reduce the diameters of metal pads on the electronic part to which a similar self-alignment installation technique is applied. However, when the metal pads are made smaller, the permissible positioning error for the provisional mounting becomes smaller. This has had a problem of increasing the installation cost.

Further, as a modification of the above self-alignment installation method, Japanese Examined Patent Publication No. 6-26227 and Japanese Unexamined Patent Publication No. 9-181208 disclose an electric part installation method that permits a large permissible positioning error for the provisional mounting, by increasing the sizes of pads at the four corners.

FIG. 1 shows one example of this conventional part installation structure.

Referring to FIG. 1, a substrate 10 on which a square optical chip part 20 is to be mounted has four large pads 11-1 for rough positioning corresponding to four corners of this optical chip part 20. On the periphery and center of this substrate 10, a large number of small pads 11-2 are provided for fine positioning. Solder bumps are provided on these pads 11-1 and 11-2 respectively. In the meantime, the optical chip part 20 is also provided with large pads 21-1 and small pads 21-2 corresponding to the pads on the substrate. In this example, the optical chip part 20 is placed on the substrate 10, with an angular deviation of θ from a normal mounting position of the optical chip part 20 on the substrate.

According to this installation method, when the large pads 11-1 and the corresponding large pads 21-1 are in contact with each other via the solder bumps to provisionally mount the optical chip part 20, the optical chip part 20 moves to a position where the small pads 21-1 of the optical chip part 20 are brought into contact with the corresponding solder bumps of the substrate based on the surface tension of the bumps of the large pads of the optical chip part 20. All the pads are accurately positioned finally based on the surface tension of all the bumps.

However, when the optical chip part 20 is disposed on the substrate 10, with an angular deviation of θ from the normal mounting position on the substrate as shown in this example, the above positioning is not achieved. In order to provide larger tolerance for this angular deviation, it is necessary to further increase the sizes of the large pads 11-1 and 21-1. In this case, the disposition area of the small pads 11-2 and 21-2 becomes smaller, and the number of these pads that can be disposed becomes smaller. Therefore, this method has had a problem in that the positional precision in the final positioning becomes lower.

DISCLOSURE OF INVENTION

In the light of the above problems, it is, therefore, an object of the present invention to provide a part installation structure that can permit larger tolerance of angular deviation in the provisional mounting as compared with that of the conventional technique, and that can realize the positioning with high precision.

According to a part installation structure of the present invention, it is possible to guarantee large tolerance of angular deviation for the part mounting, even when the conventional sizes of large pads are made smaller and/or the number of these pads is decreased. Therefore, it becomes possible to dispose small pads, in an increased number, in the increased area for disposing pads other than the large pads. As a result, it becomes easy to realize fine positioning in the order of μm that is necessary for the installation of an optical part. Further, according to the part installation structure of the present invention, there is provided an effective radiation structure for an optical part via a large metal pad that is disposed in the vicinity of the center of the optical part that has the large generation of heat of a laser diode or the like.

According to one aspect of the present invention, there is provided a part installation structure comprising: a substrate on which a plurality of first metal pads are formed; a part to be mounted having second metal pads corresponding to the positions of the first metal pads; and solder bumps for connecting between the first and second metal pads to match the installation positions of these metal pads based on the surface tension of the solder bumps when the solder bumps are fused, wherein the substrate and/or the mounted part has at least two metal pads having larger areas than those of other metal pads, in the vicinity of the center of the substrate and/or the mounted part.

According to another aspect of the present invention, there is provided a part installation structure comprising: a substrate on which a plurality of first metal pads are formed; a laser diode optical part having second metal pads corresponding to the positions of the first metal pads; and solder bumps for connecting between the first and second metal pads to match the installation positions of these metal pads based on the surface tension of the solder bumps when the solder bumps are fused, wherein the laser diode optical part has at least two metal pads having larger areas than those of other metal pads, in the vicinity of the center of the laser diode optical part, with the metal pads having large areas disposed immediately below an active layer of the laser diode optical part.

According to still another aspect of the present invention, there is provided a part installation method comprising the steps of: patterning a plurality of metal pads on a substrate and a part to be mounted respectively at corresponding positions, and preparing at least two metal pads having larger areas than those of other metal pads, in the vicinity of the center of the substrate and/or the mounted part; preparing solder bumps on the metal pads of the substrate or the mounted part; carrying out rough positioning such that the large metal pads are brought into contact with the facing solder bumps; provisionally fixing the large metal pads and the solder bumps together, by heating the substrate to a temperature at which the solder bumps are not fused; carrying out fine positioning of all the facing metal pads including the other metal pads based on the surface tension of the solder bumps, by heating the substrate to a temperature at which the solder bumps are fused; and cooling the solder bumps by stopping the heating, thereby to complete the fixed installation.

BEST MODE OF CARRYING OUT THE INVENTION

Figure 2:
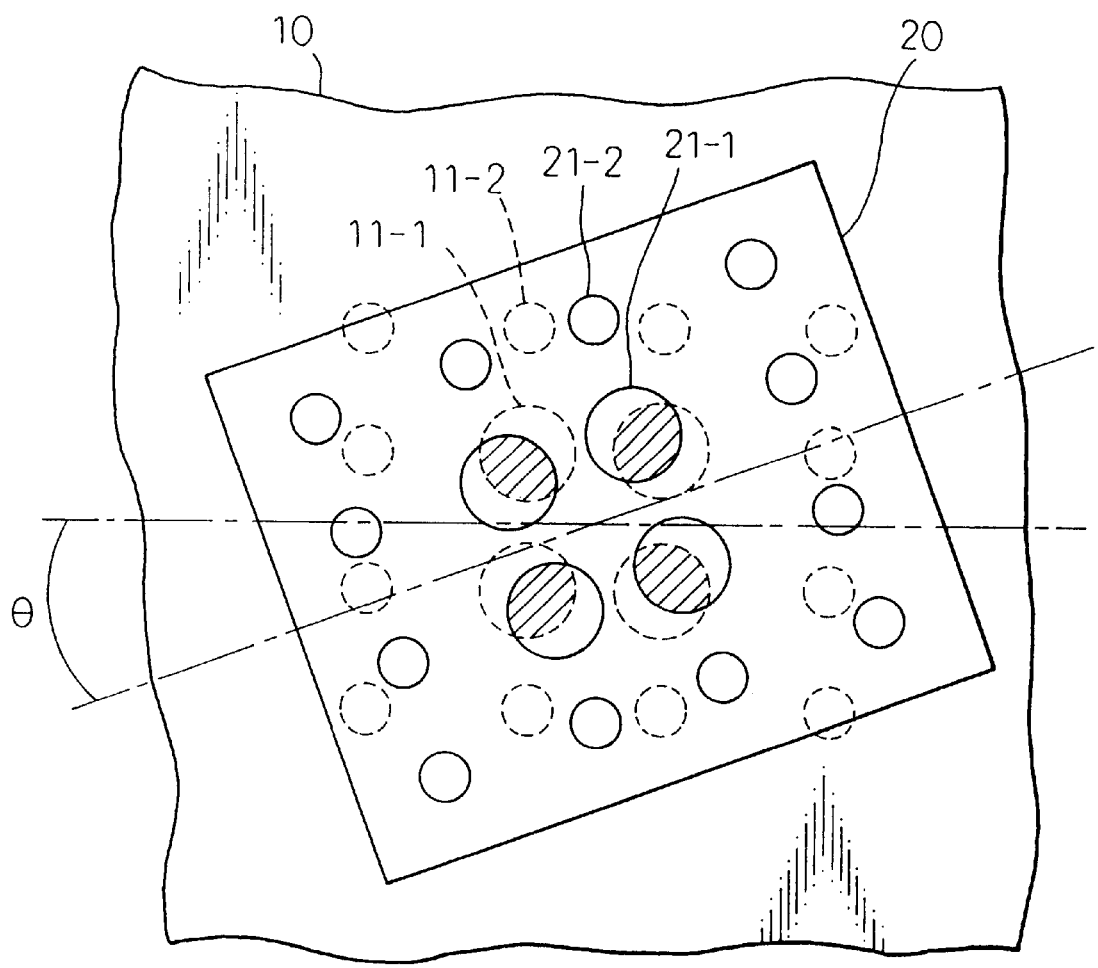
FIG. 2 is a diagram that shows one example of a basic structure of a part installation structure according to the present invention.

FIG. 2 is a diagram that shows one example of a basic structure of a part installation structure according to the present invention.

Figure 1:
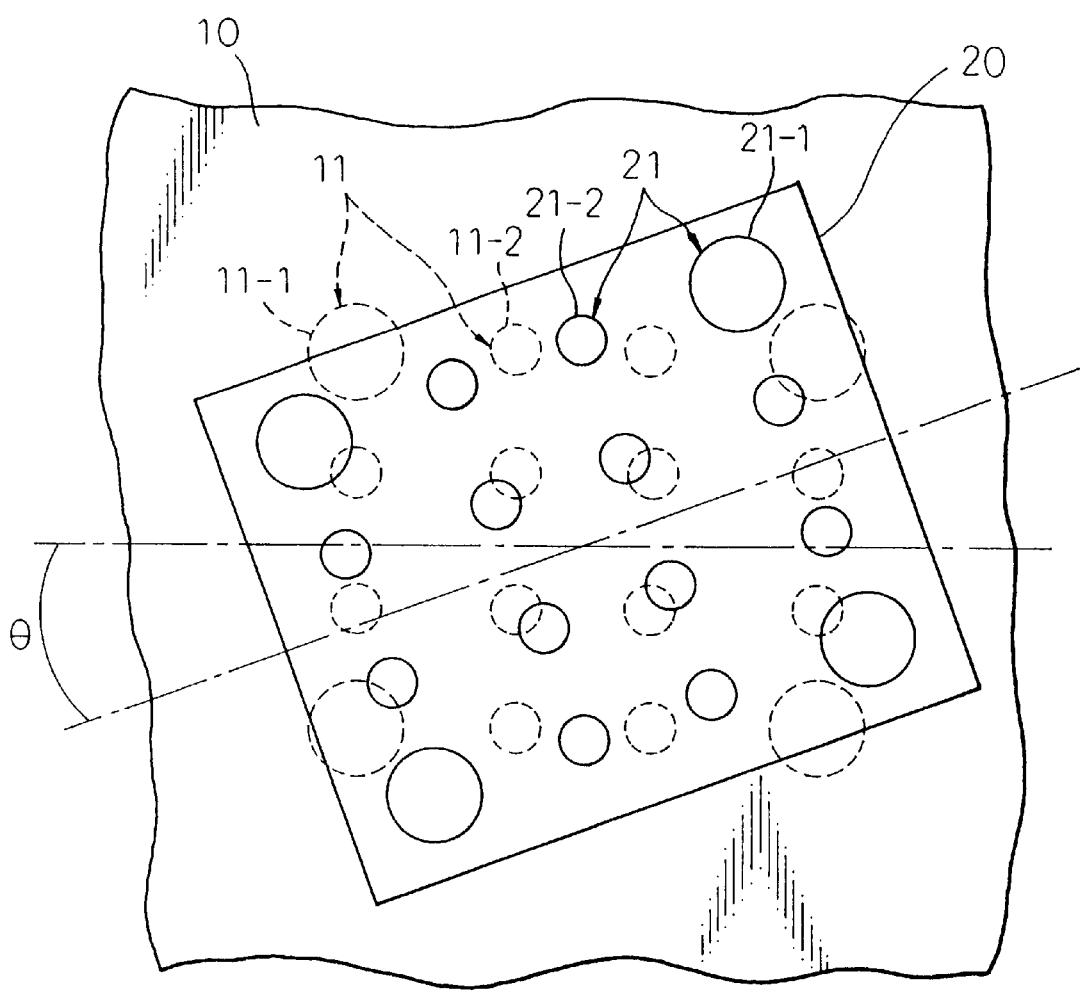
FIG. 1 is a diagram that shows one example of a conventional part installation structure.

FIG. 2 is prepared in comparison with the above-described structure of the prior art shown in FIG. 1. In FIG. 2, a substrate 10, an optical chip part 20, and large pads 11-1 and 21-1 and small pads 11-2 and 21-2 that are prepared on the substrate and the optical chip part respectively are similar to those shown in FIG. 1. According to the present invention, the large pads 11-1 and 21-1 are disposed, concentratedly in the vicinity of the center of the mounting area of the optical chip part 20.

Although the optical chip part 20 is disposed on the substrate 10 with an angular deviation of θ0 from a normal mounting position of the optical chip part 20 like the structure shown in FIG. 1, there exists a sufficient contact area (a superposition area) for contact between the large pads 11-1 and 21-1 as indicated by slanted lines in FIG. 2. Therefore, it is possible to obtain larger tolerance of angular deviation than that of the conventional structure that has the large metal pads at the four corners.

As explained above, according to the conventional structure, large metal pads are disposed at the four corners, and when a positional deviation of θ has occurred, all the metal pads are not brought into contact with the solder bumps, and the self-alignment effect cannot be obtained. On the other hand, according to the structure of the present invention, even when an angular deviation of θ has occurred, the metal pads having large diameters that are disposed in the vicinity of the center of the mounted part are brought into contact with the corresponding bumps. Therefore, the self-alignment effect is obtained, and it becomes possible to achieve the positioning.

The subsequent operation is similar to that of the conventional operation. The optical chip part 20 moves to a position where the small pads 11-2 and 21-1 are brought into contact with each other based on the surface tension of the solder bumps of the large pads 11-1 and 21-1. Finally, all the pads are accurately positioned based on the surface tension of all the bumps.

Therefore, according to the part installation structure of the present invention, it is possible to guarantee the tolerance of angular deviation that is equivalent to or larger than that of the angular deviation, even when the areas of the large pads in the vicinity of the center are made smaller than the areas of the conventional large pads and/or when the number of these large pads disposed is decreased. Therefore, it becomes possible to dispose small pads by an increased number, in the increased area for disposing other pads than the large pads. As a result, it becomes easy to realize fine positioning in the order of μm that is necessary for the installation of an optical part. Further, as is clear from FIG. 2, the large metal pads that are disposed in the vicinity of the center of the mounted part provide a radiation structure. Therefore, this structure is effective for application to a laser diode optical part having a large generation of heat.

FIGS. 3(a) to (e) show one example of a part installation process according to the present invention.

Figure 3:
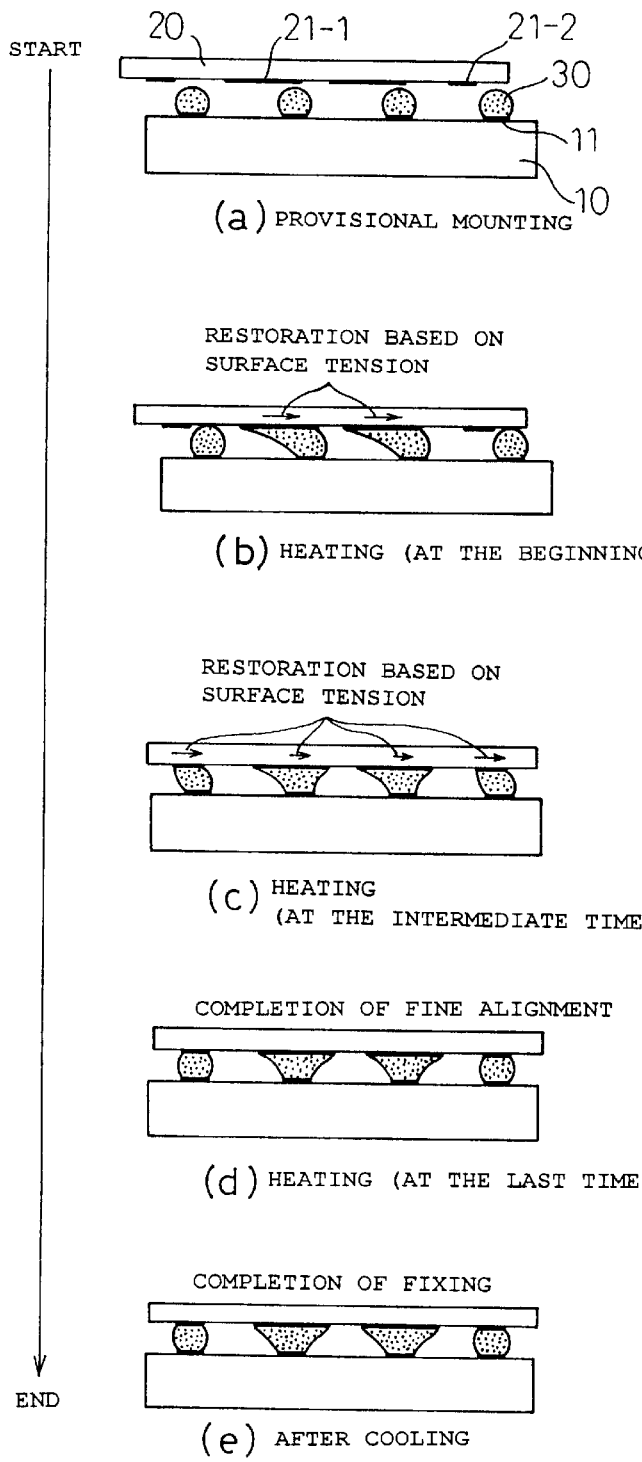
FIG. 3 is a diagram that show one example of a part installation process according to the present invention.
Figure 4:
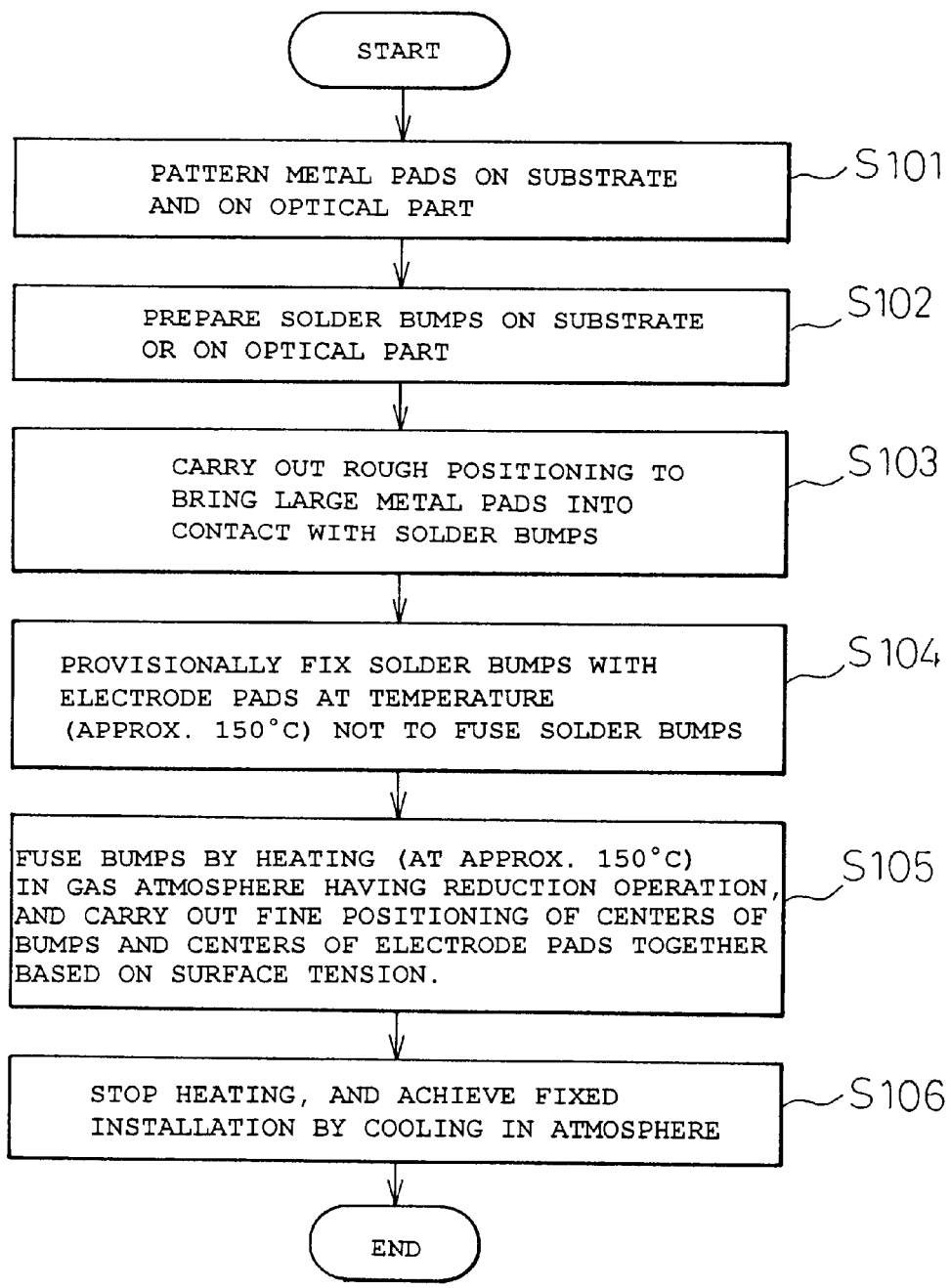
FIG. 4 is a diagram that shows one example of a processing flow of the part installation process according to the present invention.

FIG. 4 shows one example of a processing flow relevant to the part installation process shown in FIG. 3.

Prior to a provisional mounting of an optical part 20 shown in FIG. 3(a), metal pads 21-1, 21-2, and 11 are patterned on a substrate 10 and the optical part 20 to face each other (S 101). A photolithographic technique is used for this patterning. Next, solder bumps 30 are prepared on one of the substrate 10 or the optical part 20 (S 102). In FIGS. 3(a) to (e), there is shown a case where the large metal pads 21-1 are provided on only the optical part 20, and the solder bumps 30 are provided on only the substrate 10.

In the provisional mounting shown in FIG. 3(a), among the metal pads 21-1 and 21-2 that are provided on the optical part 20, at least the large electrode pads 21-1 provided in the vicinity of the center are brought into contact with the solder bumps 30 that are provided on the substrate 10. Then, the optical part 20 is roughly positioned on the substrate 10 (S 103). For mounting the optical part 20, the substrate is heated to a temperature of around 150° C. at which the solder bumps are not fused, and the large electrode pads 21-1 and the solder bumps 30 are provisionally fixed together based on a thermal compression (S 104).

Next, the substrate is heated to around 320° C. in a gas atmosphere having a reduction operation. The solder bumps 30 are fused with this heating. The centers of the large electrode pads 21-1 on the optical part 20 are attracted to the centers of the corresponding electrode pads 11 based on the surface tension of the fused solder bumps 30, as shown in FIG. 3(b). As a result, the small electrode pads 21-2 on the optical part 20 are brought into contact with the corresponding solder bumps 30, as shown in FIG. 3(c). Thereafter, the centers of the electrode pads 21-1 and 22-2 on the optical part 20 are attracted to the centers of the corresponding electrode pads 11 on the substrate 10 based on the surface tension of all the solder bumps 30. Finally, the installation position of the optical part 20 is finely aligned particularly based on the surface tension of the small electrode pads 21-2, as shown in FIG. 3(d) (S 105).

Last, the heating is stopped, and the substrate is cooled in the atmosphere. As a result, the solder bumps 30 are fixed in a positioned state, and the installation of the optical part has been completed in the state where the optical part has been precisely positioned on the substrate 10, as shown in FIG. 3(e) (S 106).

Figure 5:
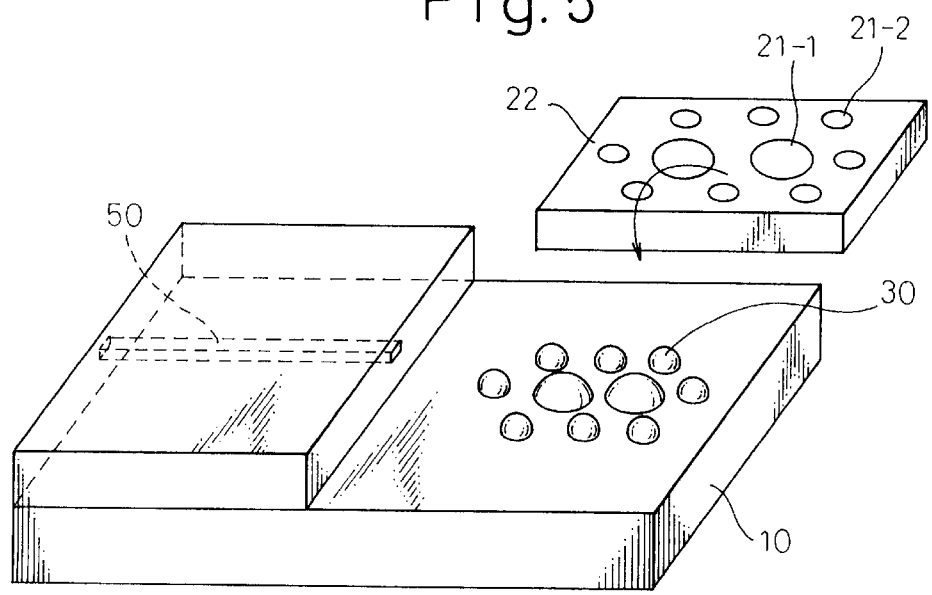
FIG. 5 is a perspective diagram that shows a first embodiment of the present invention.
Figure 6:
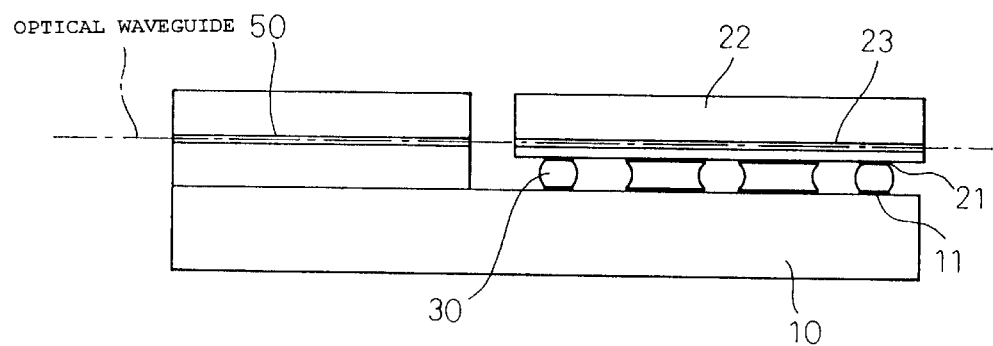
FIG. 6 is a side cross-sectional diagram that shows the first embodiment of the present invention.
Figure 7:
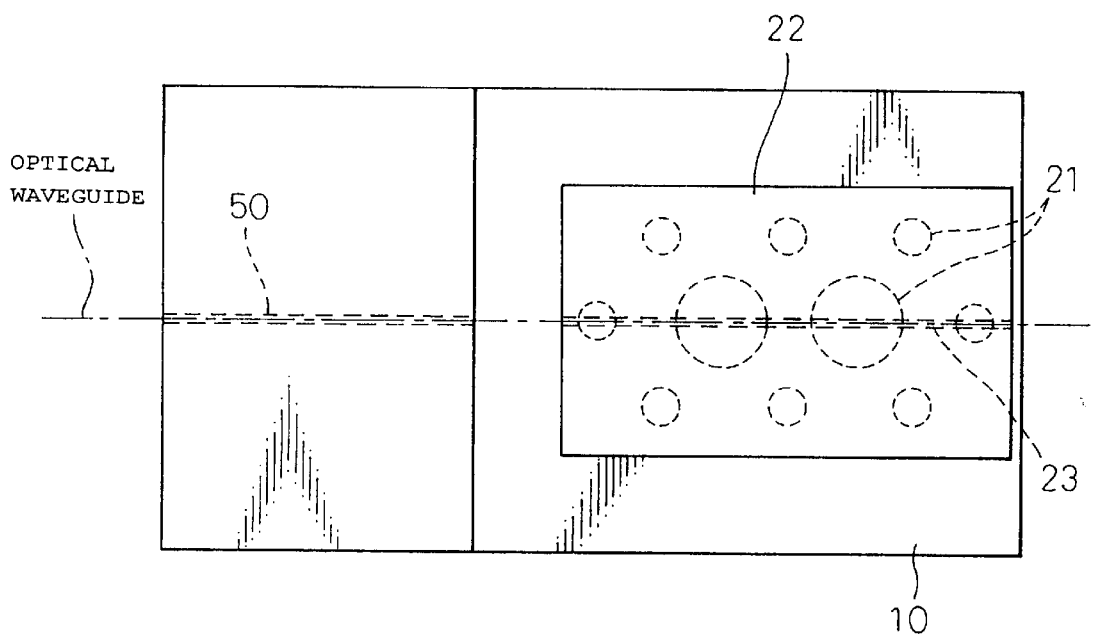
FIG. 7 is a top plan diagram that shows the first embodiment of the present invention.

FIG. 5 to FIG. 7 show a first embodiment of a part installation structure according to the present invention. FIG. 5 is a perspective diagram, FIG. 6 is a side cross-sectional diagram, and FIG. 7 is a top plan diagram of the first embodiment, respectively.

First, an optical waveguide 50 is prepared using quartz or a plastic material, in a silicon substrate 10, and a metal film is prepared on the whole surface of this silicon substrate 10 based on vacuum deposition or sputtering. Then, a pattern is formed on the metal film to prepare metal pads 11 based on a photolithographic technique, as shown in FIG. 6. In this case, the metal pads 11 are formed such that the centers of the large metal pads 11 and the center of the optical waveguide 50 coincide with each other as shown in FIG. 7. In other words, the metal pads 11 are prepared such that mutual optical axes coincide with each other.

In this example, large metal pads 11 have a diameter of 100 μm respectively, and small metal pads 11 have a diameter of 40 μm respectively. Two metal pads 11 having this large diameter are prepared as a minimum number of pads, i.e., "2", that are necessary for rough positioning, as the precision in the final positioning is determined mainly based on the number of pads having the small diameter. The installation precision is improved by increasing the number of the pads having the small diameter.

Next, solder consisting of Au by 80 weight % and Sn by 20 weight % is supplied to each pad of the diameter 100 μm, to have a solder diameter of 136 μm, and is also supplied to each pad of the diameter 40 μm, to have a solder diameter of 70 μm, in a thickness of 10 μm respectively, based on deposition or by plating. Flax is coated on solder on each pad, and the solder is fused by heating. As a result, the solder is condensed on each metal pad having sufficient wettability. Consequently, solder bumps 30 having substantially the same height are prepared as shown in FIG. 5.

Next, metal pads 21 having the same pattern as that of the metal pads on the substrate are prepared on a laser diode (LD) 22 having sizes 300 μm×500 μm (shown in FIGS. 5 and 6). This laser diode 22 is provisionally mounted on the solder bump. In this case, the metal pads 21-2 having small diameters need not be in contact with the solder bumps 30 that are formed on the substrate. It is only necessary that the metal pads 21-1 having large diameters are in contact with the corresponding solder bumps 30.

Next, the substrate on which the laser diode 22 has been provisionally mounted is heated to 320° C. in a gas atmosphere having a reduction operation like forming gas ($H_2$: 10%, and $N_2$: 90%) such that surface tension works sufficiently. The solder bump having the AuSn component is fused at this temperature. In this case, first, the solder bumps having the large diameters are wetted and are spread over the contacted large metal pads 21-1 on the laser diode 22. Based on the surface tension of the large bumps, the laser diode 22 is attracted to a position where the small metal pads 21-2 on the laser diode 22 are brought into contact with the corresponding solder bumps 30.

Thereafter, all the solder bumps 30 are wetted and spread over the corresponding metal pads 21-1 and 21-2. Based on the surface tension of all the bumps, the active layer 23 (shown in FIGS. 6 and 7) of the laser diode 22 and the core of the optical waveguide 50 are positioned with high precision. After the solder bumps 30 for connecting the large metal pads 21-1 have been settled, these solder bumps 30 have shapes of band drums that have small concentration of stress (The Japan Institute of Metals Magazine, Vol. 51, No. 6, 1987, pp. 553–560 (literature 2)) as shown in FIG. 6. It is possible to automatically obtain these connection shapes having high reliability.

As is clear from the above example, as the large metal pads 21-1 are laid out immediately below the active layer 23 of the laser diode 22, the structure according to the present invention has substantially higher radiation effect than that of the conventional example where the large metal pads are disposed at the four corners.

Figure 8:
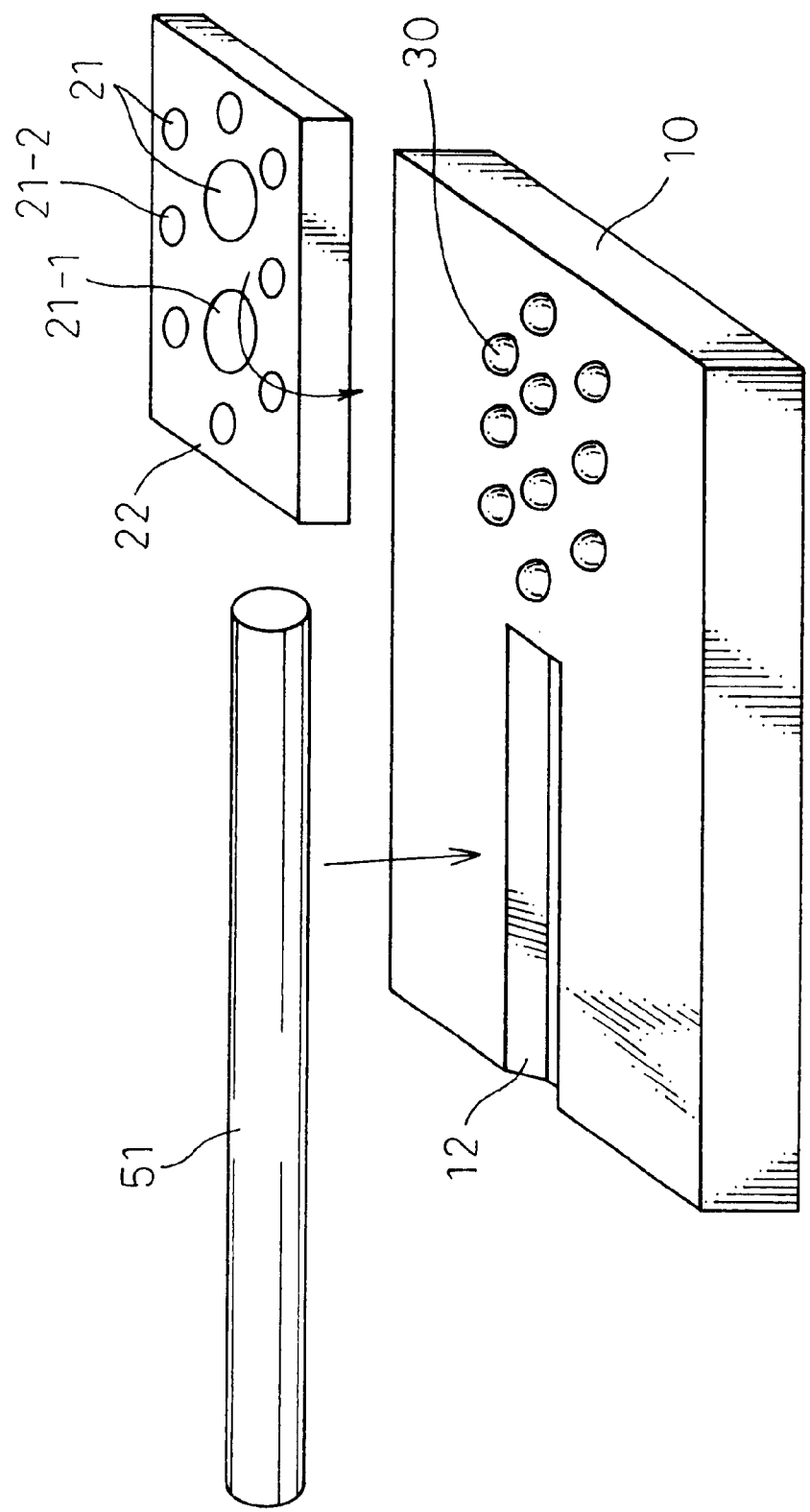
FIG. 8 is a perspective diagram that shows a second embodiment of the present invention.
Figure 9:
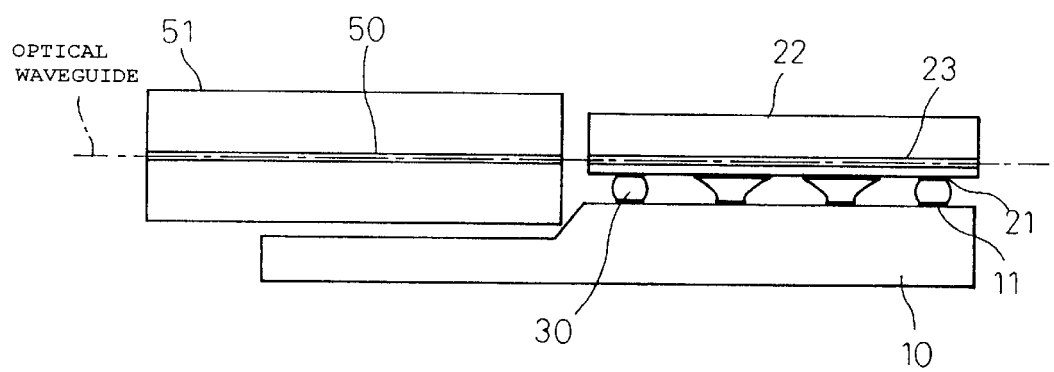
FIG. 9 is a side cross-sectional diagram that shows the second embodiment of the present invention.
Figure 10:
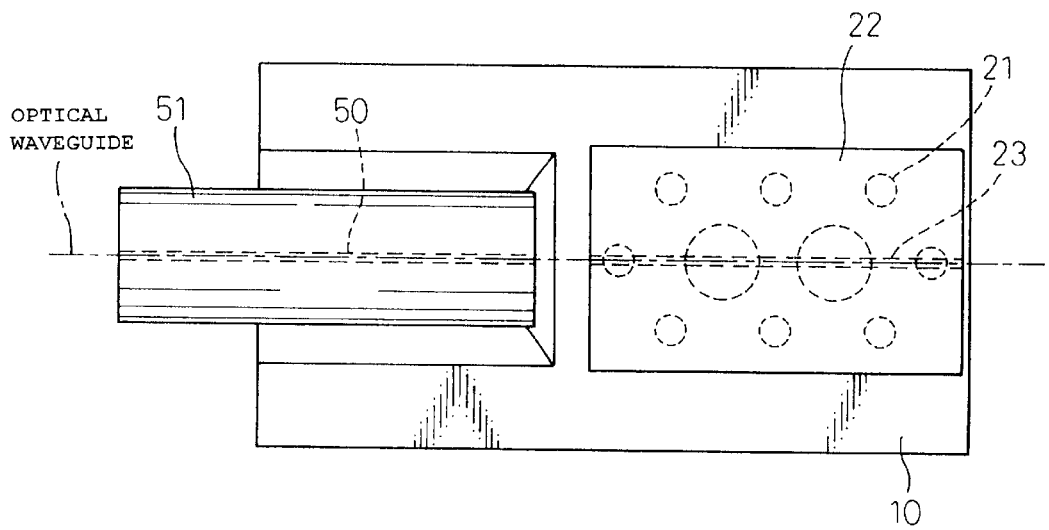
FIG. 10 is a top plan diagram that shows the second embodiment of the present invention.

FIG. 8 to FIG. 10 show a second embodiment of a part installation structure according to the present invention. FIG. 8 is a perspective diagram, FIG. 9 is a side cross-sectional diagram, and FIG. 10 is a top plan diagram of the second embodiment, respectively.

In the present example, a groove 12 is formed on a silicon substrate 10 based on anisotropic etching using an alkali etchant. Metal pads 11 are prepared such that the center of this groove 12 coincides with the centers of metal pads laid out on the optical axis on the substrate 10, in a similar manner to that of the first embodiment, as shown in FIGS. 9 and 10. In the present embodiment, all the metal pads 11 have diameters of 40 μm, as in the example shown in FIG. 3. Therefore, large metal pads are not prepared on the substrate 10.

Next, solder consisting of Au by 80 weight % and Sn by 20 weight % is supplied to each pad, to have a thickness of 10 μm and a diameter of 70 μm for the solder, in a similar manner to that of the first embodiment. Flax is coated on the solder spots, and they are fused by heating, thereby to prepare solder bumps 30. When the metal pads for preparing the solder bumps 30 have the same diameters, the quantity of solder to be applied to each pad becomes the same. Therefore, bumps can be prepared based on various methods. In other words, it becomes possible to supply AuSn foils based on a press punching method using punch and die, or supply a solder material in fine solder balls, in addition to the deposition and the plating.

Next, two metal pads having diameters of 10 μm and eight metal pads having diameters of 40 μm are prepared on a laser diode (LD) 22 having sizes 300 μm×500 μm, in the same layout as that in FIG. 5. This laser diode 22 is provisionally mounted on the solder bump 30. The substrate on which the laser diode 22 has been provisionally mounted is heated to 320° C. in a gas atmosphere having a reduction operation using forming gas ($H_2$: 10%, and $N_2$: 90%). The solder bump having the AuSn component is fused at this temperature.

When the bumps on one side (the substrate 10 side) are small, as in this example, it is also possible to carry out the positioning in a process similar to that of the first embodiment shown in FIG. 3. The precision in the final positioning is determined mainly based on the surface tension of the solder bumps 30 on the substrate 10 that are wetted and spread over the small metal pads 21-2 on the laser diode 22. Therefore, it is possible to obtain substantially the same level of connection precision as that of the first embodiment.

Last, an optical fiber 51 is engaged with the groove 12, so that the optical fiber 51 and the laser diode 22 are positioned together in high precision. Thus, fixed installation has been achieved. The present inventor has evaluated the positioning precision based on an experiment in a connection status similar to that of the second embodiment. As a result, it has been possible to obtain the mounting precision of 1 μm or less in the final positioning based on the surface tension of the solder, when the large metal pads are in contact with the corresponding solder bumps at the time of the provisional mounting.

According to the above first and second embodiments, the angular deviation up to around 46 degrees has been permitted in the provisional positioning. However, the angular deviation only up to around 13 degrees has been permitted in the provisional positioning, when the installation has been carried out in the conventional structure that a laser diode having the same sizes of 300 μm×500 μm is disposed with metal pads of diameters 500 μm at the four corners and metal pads of diameters 40 μm in the center of the laser diode. In the first and second embodiments, a laser diode has been used as the chip to be mounted. However, it is needless to mention that it is also possible to mount other optical parts and electric parts for installation in a similar manner.

Further, in the first and second embodiments, a relative positioning of two objects (the optical waveguide and the laser diode) is carried out. However, it is needless to mention that it is also possible to position optional three or more objects easily, according to the present invention. Further, while AuSn has been used for the solder material, it is needless to mention that it is also possible to use other solder materials like PbSn, Sn, etc.

As explained above, according to the present invention, it is possible to realize a self-alignment installation that can permit larger tolerance of angular deviation in the provisional mounting as compared with that of the conventional technique. Further, it is possible to achieve the final positioning with high precision. Therefore, it becomes possible to substantially lower the time for the installation in an automatic machine. This has extremely large contribution to mass production at low cost.

Further, when the chip to be mounted is an optical part in the order of μm, it is possible to obtain the precision of 1 μm or less in the final positioning based on the self-alignment effect. Therefore, this has extremely large contribution to higher quality and lower loss of optical transmission modules.

Further, according to the present invention, the large metal pads are disposed in the vicinity of the center of the optical part having large generation of heat like a laser. Therefore, the installation structure of the present invention can provide a substantially high radiation effect.

What is claimed is:

1. A part installation structure comprising:

a substrate on which a plurality of first metal pads are formed;

a part to be mounted having second metal pads corresponding to the positions of the first metal pads; and solder bumps for connecting between the first and second metal pads to match the installation positions of these metal pads based on the surface tension of the solder bumps when the solder bumps are fused, wherein the substrate and/or the mounted part has at least two metal pads having larger areas than those of other metal pads, in the vicinity of the center of the substrate and/or the mounted part.

2. The part installation structure according to claim 1, wherein two metal pads are disposed in the vicinity of the center.

3. The part installation structure according to claim 1, wherein the solder bumps are prepared on the substrate.

4. The part installation structure according to claim 1, wherein the solder bumps have the same height before the connection.

5. The part installation structure according to claim 1, wherein the first or second metal pads on which the solder bumps are prepared have the same sizes, and the solder bumps prepared also have uniform sizes.

6. The part installation structure according to claim 1, wherein the first and second metal pads have circular shapes.

7. A part installation structure comprising:

a substrate on which a plurality of first metal pads are formed;

a laser diode optical part having second metal pads corresponding to the positions of the first metal pads; and solder bumps for connecting between the first and second metal pads to match the installation positions of these metal pads based on the surface tension of the solder bumps when the solder bumps are fused, wherein the laser diode optical part has at least two metal pads having larger areas than those of other metal pads, in the vicinity of the center of the laser diode optical part, with the metal pads having large areas disposed immediately below an active layer of the laser diode optical part.

* * * * *